United States Patent
Wong et al.

(10) Patent No.: US 8,546,211 B2
(45) Date of Patent: Oct. 1, 2013

(54) REPLACEMENT GATE HAVING WORK FUNCTION AT VALENCE BAND EDGE

(75) Inventors: Keith Kwong Hon Wong, Wappingers Falls, NY (US); Michael P. Chudzik, Danbury, CT (US); Unoh Kwon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 305 days.

(21) Appl. No.: 12/948,031

(22) Filed: Nov. 17, 2010

(65) Prior Publication Data

US 2012/0119204 A1     May 17, 2012

(51) Int. Cl.
    *H01L 21/8238*     (2006.01)
(52) U.S. Cl.
    USPC ............... 438/216; 438/287; 257/E29.132; 257/E21.625; 257/E21.639
(58) Field of Classification Search
    USPC ............... 257/E21.625, E21.639, E29.132, 257/E21.429, 213, 332; 438/287, 216
See application file for complete search history.

(56) References Cited

U.S. PATENT DOCUMENTS

| | | | |
|---|---|---|---|
| 2006/0121678 A1* | 6/2006 | Brask et al. | 438/287 |
| 2009/0173979 A1* | 7/2009 | Ahn et al. | 257/296 |

* cited by examiner

*Primary Examiner* — Yu-Hsi D Sun
(74) *Attorney, Agent, or Firm* — Scully, Scott, Murphy & Presser, P.C.; H. Daniel Schnurmann

(57) ABSTRACT

Replacement gate stacks are provided, which increase the work function of the gate electrode of a p-type field effect transistor (PFET). In one embodiment, the work function metal stack includes a titanium-oxide-nitride layer located between a lower titanium nitride layer and an upper titanium nitride layer. The stack of the lower titanium nitride layer, the titanium-oxide-nitride layer, and the upper titanium nitride layer produces the unexpected result of increasing the work function of the work function metal stack significantly. In another embodiment, the work function metal stack includes an aluminum layer deposited at a temperature not greater than 420° C. The aluminum layer deposited at a temperature not greater than 420° C. produces the unexpected result of increasing the work function of the work function metal stack significantly.

16 Claims, 12 Drawing Sheets

REPLACEMENT GATE HAVING WORK FUNCTION AT VALENCE BAND EDGE

BACKGROUND

The present disclosure generally relates to semiconductor devices, and particularly to semiconductor structures having dual work function metal gates and a high-k gate dielectric, and methods of manufacturing the same.

High gate leakage current of silicon oxide and nitrided silicon dioxide as well as depletion effect of polysilicon gate electrodes limits the performance of conventional semiconductor oxide based gate electrodes. High performance devices for an equivalent oxide thickness (EOT) less than 1 nm require high dielectric constant (high-k) gate dielectrics and metal gate electrodes to limit the gate leakage current and provide high on-currents. Materials for high-k gate dielectrics include $ZrO_2$, $HfO_2$, other dielectric metal oxides, alloys thereof, and their silicate alloys.

In general, dual metal gate complementary metal oxide semiconductor (CMOS) integration schemes employ two gate materials, one having a work function near the valence band edge of the semiconductor material in the channel and the other having a work function near the conduction band edge of the same semiconductor material. In CMOS devices having a silicon channel, a conductive material having a work function of 4.0 eV is necessary for n-type metal oxide semiconductor field effect transistors (NMOSFETs, or "NFETs") and another conductive material having a work function of 5.1 eV is necessary for p-type metal oxide semiconductor field effect transistors (PMOSFETs, or "PFETs"). In conventional CMOS devices employing polysilicon gate materials, a heavily p-doped polysilicon gate and a heavily n-doped polysilicon gate are employed to address the needs. In CMOS devices employing high-k gate dielectric materials, two types of gate stacks comprising suitable materials satisfying the work function requirements are needed for the PFETs and for the NFETS, in which the gate stack for the PFETs provides a flat band voltage closer to the valence band edge of the material of the channel of the PFETs, and the gate stack for the NFETs provides a flat band voltage closer to the conduction band edge of the material of the channel of the NFETs. In other words, threshold voltages need to be optimized differently between the PFETs and the NFETs.

A challenge in semiconductor technology has been to provide two types of gate electrodes having a first work function at or near the valence band edge and a second work function at or near the conduction band edge of the underlying semiconductor material such as silicon. This challenge has been particularly difficult because the two types of gate electrodes are also required to be a metallic material having a high electrical conductivity.

SUMMARY

Replacement gate stacks are provided, which increase the work function of the gate electrode of a p-type field effect transistor (PFET) so that the work function approaches the energy level of the valence band edge of silicon. In one embodiment, the work function metal stack includes a titanium-oxide-nitride layer located between a lower titanium nitride layer and an upper titanium nitride layer. When formed over underlying work function metal layers and below an aluminum layer, the stack of the lower titanium nitride layer, the titanium-oxide-nitride layer, and the upper titanium nitride layer produces an unexpected result of increasing the work function of the work function metal stack significantly, e.g., by about 70 mV. In another embodiment, the work function metal stack includes an aluminum layer deposited at a temperature not greater than 420° C., which is lower than conventional deposition temperatures for aluminum layer and significantly reduces reflow of the deposited aluminum material. The aluminum layer deposited at a temperature not greater than 420° C. produces an unexpected result of increasing the work function of the work function metal stack significantly, e.g., by about 70 mV. The formation of the titanium-oxide-nitride layer and deposition of the aluminum layer deposited at a temperature not greater than 400° C. can be employed in tandem to increase the work function of a work function metal stack.

According to an aspect of the present disclosure, a method of forming a semiconductor structure including a field effect transistor is provided. The method includes: forming a disposable gate structure on a semiconductor substrate; forming and planarizing a planarization dielectric layer, wherein a top surface of the planarization dielectric layer is coplanar with a top surface of the disposable gate structure; recessing the disposable gate structure to form a gate cavity; and forming a replacement gate stack in the cavity, wherein the replacement gate stack is formed by depositing and patterning a stack including, from bottom to top, a gate dielectric layer, a work function metal layer, at least one barrier metal layer, and an aluminum-including layer, wherein the aluminum layer is deposited at a temperature not greater than 420 degrees Celsius.

According to another aspect of the present disclosure, a method of forming a semiconductor structure including a field effect transistor is provided. The method includes: forming a disposable gate structure on a semiconductor substrate; forming and planarizing a planarization dielectric layer, wherein a top surface of the planarization dielectric layer is coplanar with a top surface of the disposable gate structure; recessing the disposable gate structure to form a gate cavity; and forming a replacement gate stack in the cavity, wherein the replacement gate stack is formed by depositing and patterning a stack including at least a gate dielectric layer, a lower barrier metal layer including a metal, a metal oxide monolayer including an oxide of the metal and contacting the lower barrier metal layer, an upper barrier metal layer contacting the metal oxide monolayer.

According to yet another aspect of the present disclosure, a semiconductor structure including a field effect transistor is provided. The field effect transistor contains a gate stack, which includes: a gate dielectric located on a semiconductor substrate; a lower barrier metal portion including a metal and located on the gate dielectric; a metal oxide monolayer portion including an oxide of the metal and contacting the lower barrier metal portion; and an upper barrier metal portion contacting the metal oxide monolayer portion.

DETAILED DESCRIPTION

Figure 1:
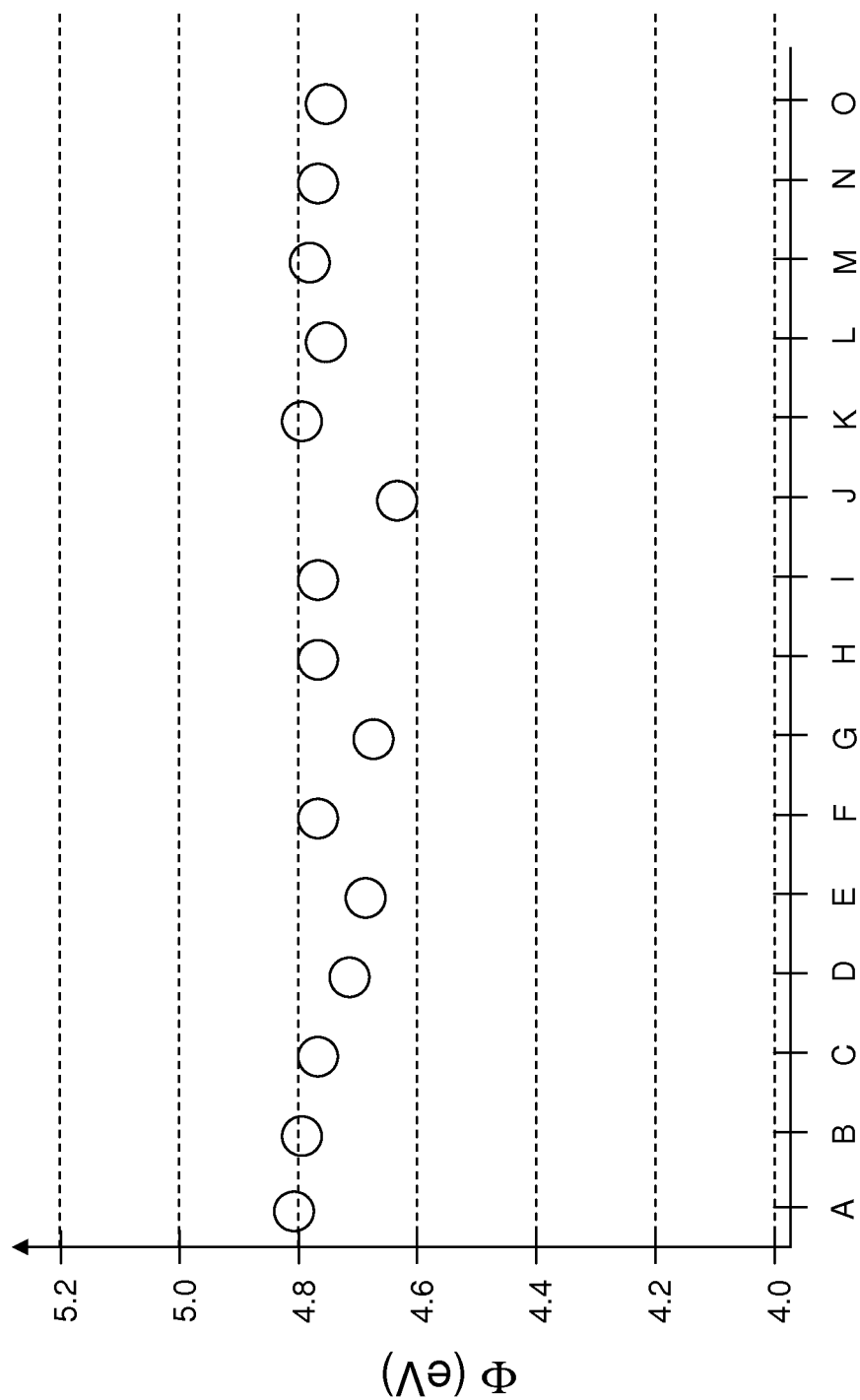
FIG. 1 is a graph comparing the work function of various replacement gate stacks as measured on test samples subjected to various oxidation processes during formation of the respective replacement gate during a research leading to the present disclosure.

As stated above, the present disclosure relates to semiconductor structures having dual work function metal gates and a high-k gate dielectric, and methods of manufacturing the same, which are now described in detail with accompanying figures. Like and corresponding elements mentioned herein and illustrated in the drawings are referred to by like reference numerals. The drawings are not necessarily drawn to scale.

Referring to FIG. 1, a graph compares the work function of various replacement gate stacks that were tested during the course of research that lead to the present disclosure. Test samples each including different types of replacement gate stacks were subjected to various oxidation processes. These various samples are labeled as sample A through sample O, Sample A included a base film stack, from which deviations were introduced in other samples. Specifically, sample A included a gate stack consisting of, from bottom to top, a 2.5 nm thick hafnium oxide gate dielectric, a 2 nm thick titanium nitride work function layer, 1.5 nm thick tantalum nitride layer, a 5 nm thick titanium nitride layer deposited by atomic layer deposition, a 3 nm thick titanium-aluminum alloy layer, a 8 nm thick titanium nitride layer deposited by atomic layer deposition, and 10 nm titanium layer, and a 300 nm thick aluminum layer deposited at 440° C. in two steps of physical vapor deposition. Tables 1A and 1B below tabulate the various deviations for other samples from the process employed for sample A.

TABLE 1A

Processing conditions for lower layers in various replacement gate stacks.

| Sample | Hafnium oxide (HfO$_2$) | Oxidation after HfO$_2$ deposition | Titanium nitride (TiN) | Oxidation after TiN deposition | Tantalum nitride (TaN) by ALD | Oxidation after TaN deposition |
|---|---|---|---|---|---|---|
| A | 2.5 nm | NONE | 2 nm | NONE | 1.5 nm | NONE |
| B | 2.5 nm | 400° C., 10 Torr O$_2$, 1 min | 2 nm | NONE | 1.5 nm | NONE |
| C | 2.5 nm | 400° C., 10 Torr O$_2$, 5 min | 2 nm | NONE | 1.5 nm | NONE |
| D | 2.5 nm | NONE | 2 nm | 400° C., 10 Torr O$_2$, 1 min | 1.5 nm | NONE |
| E | 2.5 nm | NONE | 2 nm | 400° C., 10 Torr O$_2$, 5 min | 1.5 nm | NONE |
| F | 2.5 nm | NONE | 2 nm | NONE | 1.5 nm | 400° C., 10 Torr O$_2$, 1 min |
| G | 2.5 nm | NONE | 2 nm | NONE | 1.5 nm | 400° C., 10 Torr O$_2$, 5 min |
| H | 2.5 nm | NONE | 2 nm | NONE | 1.5 nm | NONE |
| I | 2.5 nm | NONE | 2 nm | NONE | 1.5 nm | NONE |
| J | 2.5 nm | NONE | 2 nm | NONE | 1.5 nm | NONE |
| K | 2.5 nm | NONE | 2 nm | NONE | 1.5 nm | NONE |
| L | 2.5 nm | NONE | 2 nm | NONE | 1.5 nm | NONE |
| M | 2.5 nm | NONE | 2 nm | NONE | 1.5 nm | NONE |
| N | 2.5 nm | NONE | 2 nm | NONE | 1.5 nm | NONE |
| O | 2.5 nm | NONE | 2 nm | NONE | 1.5 nm | NONE |

TABLE 1B

Processing conditions for upper layers in various replacement gate stacks.

| Sample | First titanium nitride by ALD | Oxidation After TiAl alloy deposition | Titanium-aluminum (TiAl) alloy | Oxidation After TiAl alloy deposition | Second TiN by ALD | Oxidation after TiN deposition |
|---|---|---|---|---|---|---|
| A | 5 nm | NONE | 3 nm | NONE | 8 nm | NONE |
| B | 5 nm | NONE | 3 nm | NONE | 8 nm | NONE |
| C | 5 nm | NONE | 3 nm | NONE | 8 nm | NONE |

TABLE 1B-continued

Processing conditions for upper layers in various replacement gate stacks.

| Sample | First titanium nitride by ALD | Oxidation After TiAl alloy deposition | Titanium-aluminum (TiAl) alloy | Oxidation After TiAl alloy deposition | Second TiN by ALD | Oxidation after TiN deposition |
|---|---|---|---|---|---|---|
| D | 5 nm | NONE | 3 nm | NONE | 8 nm | NONE |
| E | 5 nm | NONE | 3 nm | NONE | 8 nm | NONE |
| F | 5 nm | NONE | 3 nm | NONE | 8 nm | NONE |
| G | 5 nm | NONE | 3 nm | NONE | 8 nm | NONE |
| H | 5 nm | 400° C., 10 Torr $O_2$, 1 min | 3 nm | NONE | 8 nm | NONE |
| I | 5 nm | 400° C., 10 Torr $O_2$, 5 min | 3 nm | NONE | 8 nm | NONE |
| J | 3 nm | 400° C., 10 Torr $O_2$, 5 min | 3 nm | NONE | 8 nm | NONE |
| K | 8 nm | 400° C., 10 Torr $O_2$, 5 min | 3 nm | NONE | 8 nm | NONE |
| L | 5 nm | NONE | 3 nm | Exposure to air, 30 min, 20° C. | 8 nm | NONE |
| M | 5 nm | NONE | 3 nm | 400° C., 10 Torr $O_2$, 1 min | 8 nm | NONE |
| N | 5 nm | NONE | 3 nm | NONE | 8 nm | 400° C., 10 Torr $O_2$, 1 min |
| O | 5 nm | NONE | 3 nm | NONE | 8 nm | 400° C., 10 Torr $O_2$, 1 min |

The 10 nm titanium layer and a 300 m thick aluminum layer deposited at 440° C. in two steps of physical vapor deposition were common across all tested samples shown in FIG. 1. FIG. 1 shows that the work function of samples B-O is not greater than the work function of the reference sample, i.e., sample A. Thus, the various oxidation processes introduced to samples B-O not only fail to increase the work function of the replacement gate stacks, but tend to decrease the work function of the various tested replacement gate stacks. In general, therefore, oxidizing any portion of a metal layer in a replacement gate stack is likely to have a detrimental effect of reducing the work function, if the effect is present at all. In other words, reduction of work function is expected when any metal layer in a replacement gate stack is subjected to any type of oxidation.

Figure 2:
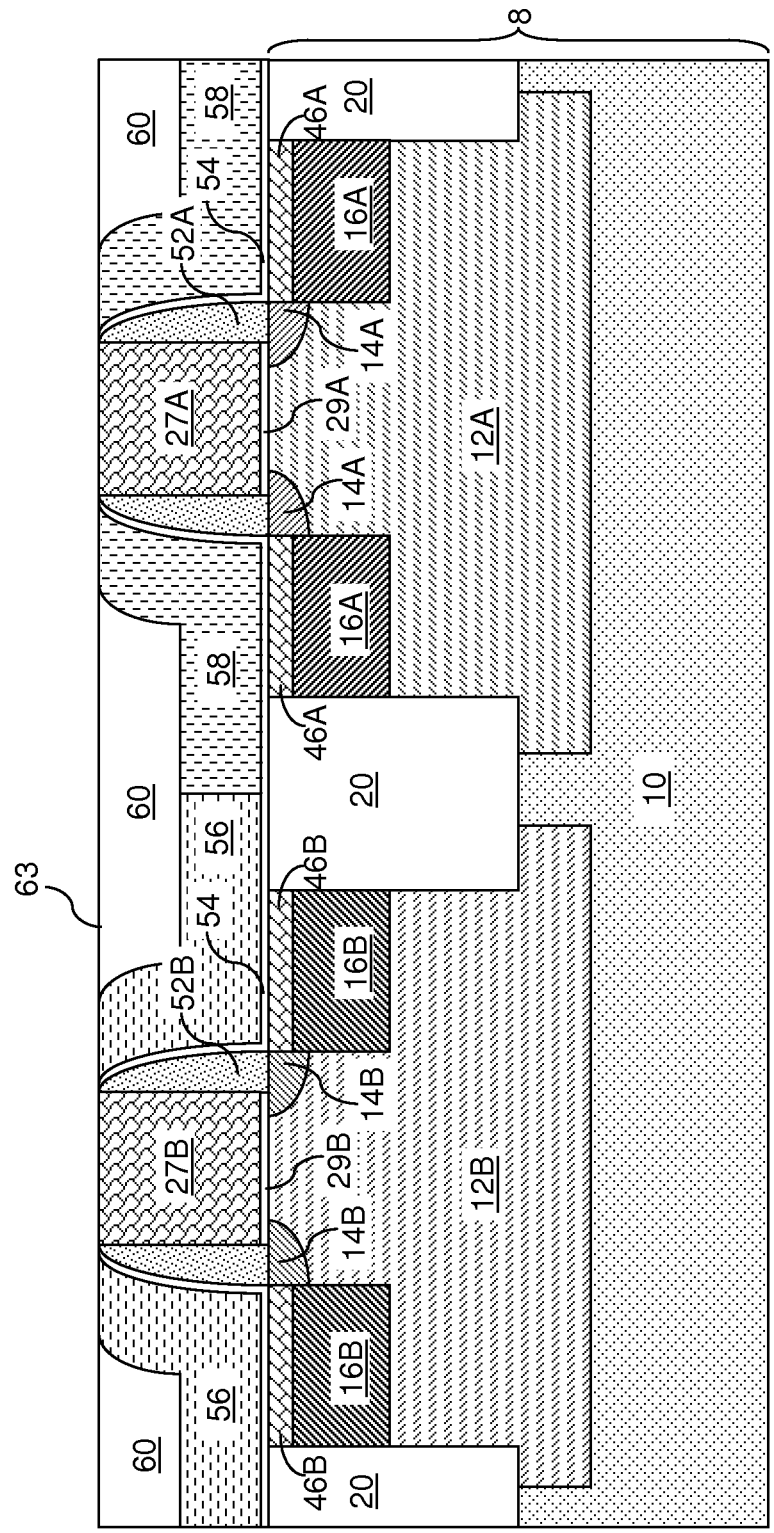
FIG. 2 is vertical cross-sectional view of an exemplary semiconductor structure after formation of disposable gate structures and formation of a planar dielectric surface on a planarization dielectric layer according to an embodiment of the present disclosure.

Referring to FIG. 2, an exemplary semiconductor structure according to an embodiment of the present disclosure includes a semiconductor substrate 8, on which various components of field effect transistors are formed. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer.

Various portions of the semiconductor material in the semiconductor substrate 8 can be doped with electrical dopants of p-type or n-type at different dopant concentration levels. For example, the semiconductor substrate 8 may include an underlying semiconductor layer 10, a first conductivity type well 12B, and a second-conductivity type well 12A. The first conductivity type well 12B is doped with electrical dopants of a first conductivity type, which can be p-type or n-type. The second conductivity type well 12A is doped with electrical dopants of a second conductivity type, which is the opposite type of the first conductivity type. For example, if the first conductivity type is p-type, the second conductivity type is n-type, and vice versa.

Shallow trench isolation structures 20 are formed to laterally separate each of the first conductivity type well 12B and the second conductivity type well 12A. Typically, each of the first conductivity type well 12B and the second conductivity type well 12A is laterally surrounded by a contiguous portion of the shallow trench isolation structures 20. If the semiconductor substrate 8 is a semiconductor-on-insulator substrate, bottom surfaces of the first conductivity type well 12B and the second conductivity type well 12A may contact a buried insulator layer (not shown), which electrically isolates each of the first conductivity type well 12B and the second conductivity type well 12A from other semiconductor portions of the semiconductor substrate 8 in conjunction with the shallow trench isolation structures 20.

A disposable dielectric layer and a disposable gate material layer are deposited and lithographically patterned to form disposable gate structures. For example, the disposable gate stacks may include a first disposable gate structure that is a stack of a first disposable dielectric portion 29A and a first disposable gate material portion 27A and a second disposable gate structure that is a stack of a second disposable dielectric portion 29B and a second disposable gate material portion 27B. The disposable dielectric layer includes a dielectric material such as a semiconductor oxide. The disposable gate material layer includes a material that can be subsequently removed selective to dielectric material such as a semiconductor material. The first disposable gate structure (29A, 27A) is formed over the second conductivity type well 12A, and the second disposable gate structure (29B, 27B) is formed over the first conductivity type well 12B. The height of the first disposable gate structure (29A, 27A) and the second disposable gate structure (29B, 27B) can be from 20 nm to 500 nm, and typically from 40 nm to 250 nm, although lesser and greater heights can also be employed.

Dopants of the first conductivity type are implanted into portions of the second conductivity type well 12A that are not covered by the first disposable gate structure (29A, 27A) to form first source and drain extension regions 14A. The first conductivity type well 12B can be masked by a photoresist (not shown) during the implantation of the first conductivity type dopants to prevent implantation of the first conductivity type dopants therein. Similarly, dopants of the second conductivity type are implanted into portions of the first conductivity type well 12B that are not covered by the second disposable gate structure (29B, 27B) to form second source and drain extension regions 14B. The second conductivity type well 12A can be masked by a photoresist (not shown) during the implantation of the second conductivity type dopants to prevent implantation of the second conductivity type dopants therein.

Dielectric gate spacers are formed on sidewalls of each of the disposable gate structures, for example, by deposition of a conformal dielectric material layer and an anisotropic etch. The dielectric gate spacers include a first dielectric gate spacer 52A formed around the first disposable gate structure (29A, 27A) and a second dielectric gate spacer 52B formed around the second disposable gate structure (29B, 27B).

Dopants of the first conductivity type are implanted into portions of the second conductivity type well 12A that are not covered by the first disposable gate structure (29A, 27A) and the first dielectric gate spacer 52A to form first source and drain regions 16A. The first conductivity type well 12B can be masked by a photoresist (not shown) during the implantation of the first conductivity type dopants to prevent implantation of the first conductivity type dopants therein. Similarly, dopants of the second conductivity type are implanted into portions of the first conductivity type well 12B that are not covered by the second disposable gate structure (29B, 27B) and the second dielectric gate spacer 52B to form second source and drain regions 16B. The second conductivity type well 12A can be masked by a photoresist (not shown) during the implantation of the second conductivity type dopants to prevent implantation of the second conductivity type dopants therein.

In some embodiments, the first source and drain regions 16A and/or the second source and drain regions 16B can be formed by replacement of the semiconductor material in the second conductivity type well 12A and/or the semiconductor material in the first conductivity type well 12B with a new semiconductor material having a different lattice constant. In this case, the new semiconductor material(s) is/are typically epitaxially aligned with (a) single crystalline semiconductor material(s) of the second conductivity type well 12A and/or the semiconductor material in the first conductivity type well 12B, and apply/applies a compressive stress or a tensile stress to the semiconductor material of the second conductivity type well 12A and/or the semiconductor material in the first conductivity type well 12B between the first source and drain extension regions 14A and/or between the second source and drain extension regions 14B.

First metal semiconductor alloy portions 46A and second metal semiconductor alloy portions 46B are formed on exposed semiconductor material on the top surface of the semiconductor substrate 8, for example, by deposition of a metal layer (not shown) and an anneal. Unreacted portions of the metal layer are removed selective to reacted portions of the metal layer. The reacted portions of the metal layer constitute the metal semiconductor alloy portions (46A, 46B), which can include a metal silicide portions if the semiconductor material of the first and second source and drain regions (16A, 16B) include silicon.

Optionally, a dielectric liner 54 may be deposited over the metal semiconductor alloy portions 54, the first and second disposable gate structures (29A, 27A, 29B, 27B), and the first and second dielectric gate spacers (52A, 52B). A first type stress-generating liner 58 and a second type stress-generating liner 56 can be formed over the first disposable gate structure (29A, 27A) and the second disposable gate structure (29B, 27B), respectively. The first type stress-generating liner 58 and/or the second type stress-generating liner 56 can be employed to apply uniaxial or biaxial lateral stress to a first channel region, which is the portion of the second conductivity type well 12A between the first source and drain extension regions 14A, and/or to a second channel region, which is the portion of the first conductivity type well 12B between the second source and drain extension regions 14B, respectively.

In one embodiment, one of the first type stress-generating liner 58 and the second type stress-generating liner 56 applies a compressive stress if underlying source and drain regions (i.e., the first source and drain regions 16A or the second source and drain regions 16B) are p-doped regions, and the other of the first type stress-generating liner 58 or the second type stress-generating liner 56 applies a tensile stress if underlying source and drain regions (i.e., the second source and drain regions 16B and the first source and drain regions 16A) are n-doped regions. The first type stress-generating liner 58 and the second type stress-generating liner 56 can include a dielectric material that generates a compressive stress or a tensile stress to underlying structures, and can be silicon nitride layers deposited by plasma enhanced chemical vapor deposition under various plasma conditions.

A planarization dielectric layer 60 is deposited over the first type stress-generating liner 58 and/or the second type stress-generating liner 56, if present, or over the metal semiconductor alloy portions 54, the first and second disposable gate structures (29A, 27A, 29B, 27B), and the first and second dielectric gate spacers (52A, 52B) if (a) stress-generating liner(s) is/are not present. Preferably, the planarization dielectric layer 60 is a dielectric material that may be easily planarized. For example, the planarization dielectric layer 60 can be a doped silicate glass or an undoped silicate glass (silicon oxide).

The planarization dielectric layer 60, the first type stress-generating liner 58 and/or the second type stress-generating liner 56 (if present), and the dielectric liner 54 (if present) are planarized above the topmost surfaces of the first and second disposable gate structures (29A, 27A, 29B, 27B), i.e., above the topmost surfaces of the first and second disposable gate material portions (27A, 27B). The planarization can be performed, for example, by chemical mechanical planarization (CMP). The planar topmost surface of the planarization dielectric layer 60 is herein referred to as a planar dielectric surface 63.

In one embodiment, the first conductivity type is p-type and the second conductivity type is n-type. The first source and drain extension regions 14A and the first source and drain regions 16A are p-doped, and the second conductivity type well 12A is n-doped. The combination of the first source and drain extension regions 14A, the first source and drain regions 16A, and the second conductivity type well 12A can be employed to subsequently form a p-type field effect transistor. Correspondingly, the first source and drain extension regions 14A and the first source and drain regions 16A are n-doped, and the second conductivity type well 12A is p-doped. The combination of the first source and drain extension regions 14A, the first source and drain regions 16A, and the second conductivity type well 12A can be employed to subsequently form an n-type field effect transistor. The first type stress-generating liner 58 can apply a tensile stress to the first channel, and the second type stress-generating liner 56 can apply a compressive stress to the second channel.

In another embodiment, the first conductivity type is n-type and the second conductivity type is p-type. The first source and drain extension regions 14A and the first source and drain regions 16A are n-doped, and the second conductivity type well 12A is p-doped. The combination of the first source and drain extension regions 14A, the first source and drain regions 16A, and the second conductivity type well 12A can be employed to subsequently form an n-type field effect transistor. Correspondingly, the first source and drain extension regions 14A and the first source and drain regions 16A are p-doped, and the second conductivity type well 12A is n-doped. The combination of the first source and drain extension regions 14A, the first source and drain regions 16A, and the second conductivity type well 12A can be employed to subsequently form a p-type field effect transistor. The first type stress-generating liner 58 can apply a compressive stress to the first channel, and the second type stress-generating liner 56 can apply a tensile stress to the second channel.

Figure 3:
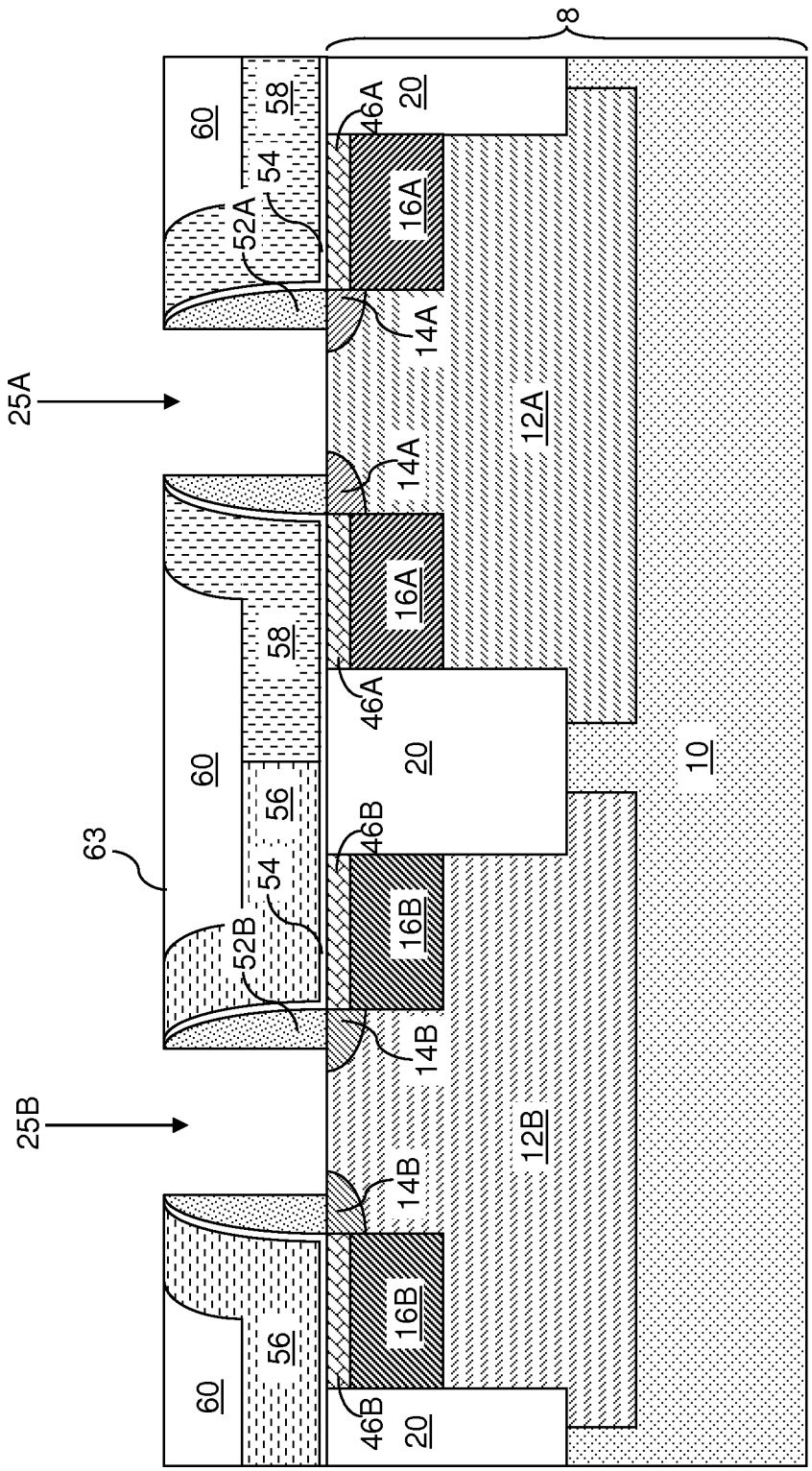
FIG. 3 is a vertical cross-sectional view of the exemplary semiconductor structure of FIG. 2 after removal of the disposable gate structures.

Referring to FIG. 3, the first disposable gate structure (29A, 27A) and the second disposable gate structure (29B, 27B) are removed by at least one etch. The at least one etch can be a recess etch, which can be an isotropic etch or anisotropic etch. The etch employed to remove the first and second disposable gate material portions (27A, 27B) is preferably selective to the dielectric materials of the planarization dielectric layer 60, the first type stress-generating liner 58 and/or the second type stress-generating liner 56 (if present), and the first and second dielectric gate spacers (52A, 52B). Optionally, one or both of the dielectric portions (29A, 29B) can be left by etching selective to these layers. The disposable gate structures (29A, 27A, 29B, 27B) are recessed below the planar dielectric surface 63 and to expose the semiconductor surfaces above the first channel and the second channel to form gate cavities (25A, 25B) over the semiconductor substrate.

Optionally, a first semiconductor-element-containing dielectric layer 31A can be formed on the exposed surface of the second conductivity type well 12A by conversion of the exposed semiconductor material into a dielectric material, and a second semiconductor-element-containing dielectric layer 31B can be formed on the exposed surface of the first conductivity type well 12B by conversion of the exposed semiconductor material into the dielectric material. The formation of the semiconductor-element-containing dielectric layers (31A, 31B) can be effected by thermal conversion or plasma treatment. If the semiconductor material of the second conductivity type well 12A and the first conductivity type well 12B includes silicon, the semiconductor-element-containing dielectric layers (31A, 31B) can include silicon oxide or silicon nitride. The semiconductor-element-containing dielectric layers (31A, 31B) are interfacial dielectric layers that contact a semiconductor surface underneath and gate dielectrics to be subsequently deposited thereupon.

Figure 4:
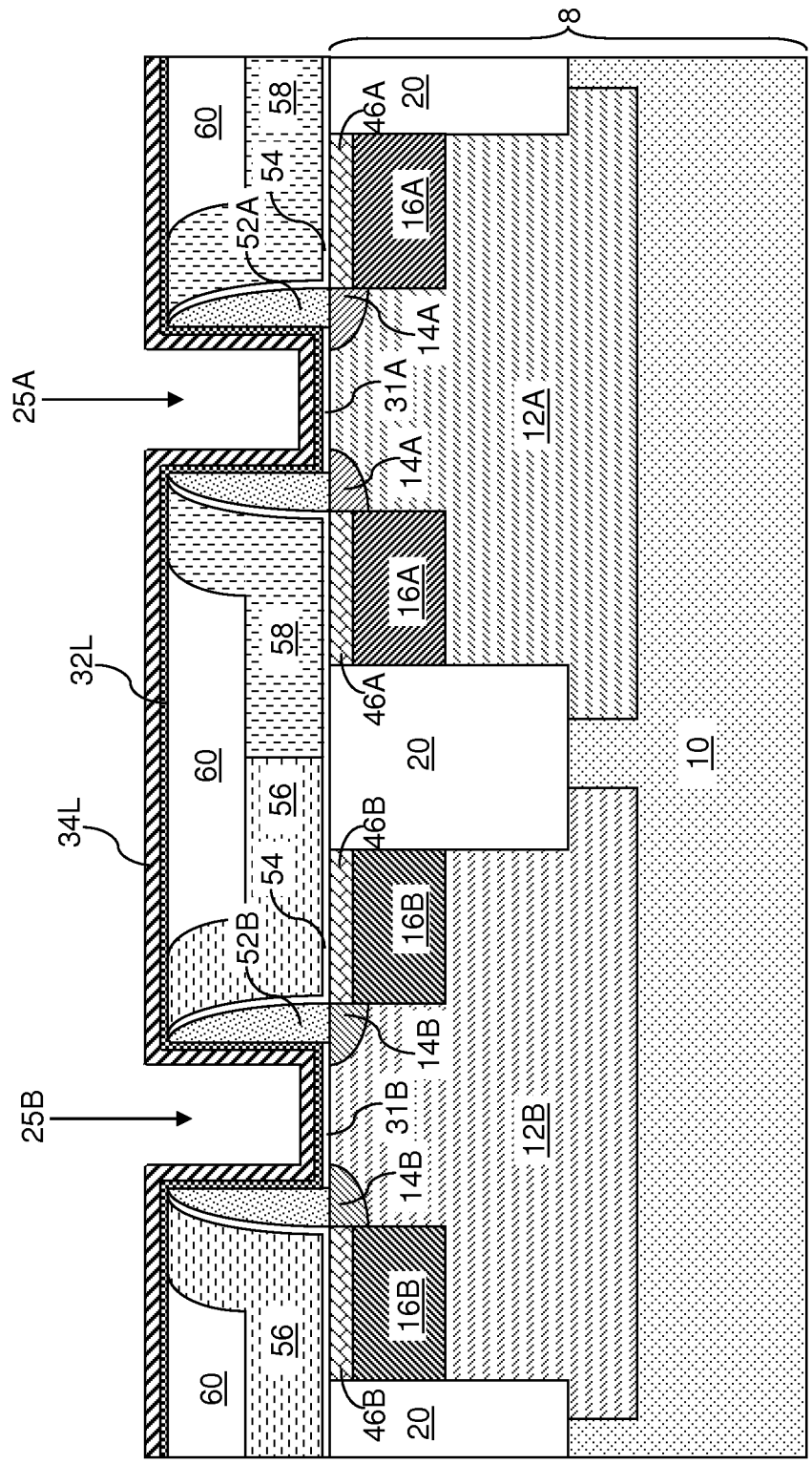
FIG. 4 is a vertical cross-sectional view of the exemplary semiconductor structure of FIG. 3 after formation of a first-type work function metal layer.

Referring to FIG. 4, a contiguous gate dielectric layer 32L and a first-type work function metal layer 34L including a first metal having a first work function are sequentially formed for form a stack, from bottom to top, of the contiguous gate dielectric layer 32L and the first-type work function metal layer 34L. The contiguous gate dielectric layer 32L can be a high dielectric constant (high-k) material layer having a dielectric constant greater than 8.0. The contiguous gate dielectric layer 32L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the contiguous gate dielectric layer 32L, as measured at horizontal portions, can be from 0.9 nm to 6 nm, and preferably from 1.0 nm to 3 nm. The high-k material layer 32L may have an effective oxide thickness on the order of or less than 1 nm.

The first-type work function metal layer 34L includes a first metal, which has a first work function. The first metal of the first-type work function metal layer 34L is selected to optimize the performance of a transistor to be subsequently formed employing the first source and drain extension regions 14A, the first source and drain regions 16A, and the second conductivity type well 12A.

In a first embodiment, the first conductivity type is p-type and the semiconductor material of the second conductivity type well 12A includes n-doped silicon, and the first-type work function metal layer 34L includes a silicon valence band edge metals such as Pt, Rh, Ir, Ru, Cu, Os, Be, Co, Pd, Te, Cr, Ni, TiN, and alloys thereof. A silicon valence band edge metal is a metal having a work function that is closer to the work function corresponding to the valence band edge of silicon, i.e., 5.10 eV, than to the work function corresponding to the conduction band edge of silicon, i.e., 4.00 eV. Thus, a silicon valence band edge metal has a work function that is greater than 4.55 eV. For example, the first-type work function metal layer 34L can be a layer of TiN.

In a second embodiment, the first conductivity type is n-type and the semiconductor material of the second conductivity type well 12A includes p-doped silicon, and the first-type work function metal layer 34L includes a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. A silicon conduction band edge metal is a metal having a work function that is closer to the work function corresponding to the conduction band edge of silicon than to the work function corresponding to the valence band edge of silicon. Thus, a silicon conduction band edge metal has a work function that is less than 4.55 eV. For example, the first-type work function metal layer 34L can be a layer of TiAl.

The first-type work function metal layer 34L can be formed, for example, by physical vapor deposition, chemical vapor deposition, or atomic layer deposition (ALD). The thickness of the first-type work function metal layer 34L is typically set at a value from 1 nm to 30 nm, and more typically, from 2 nm to 10 nm, although lesser and greater thicknesses can also be employed.

Figure 5:
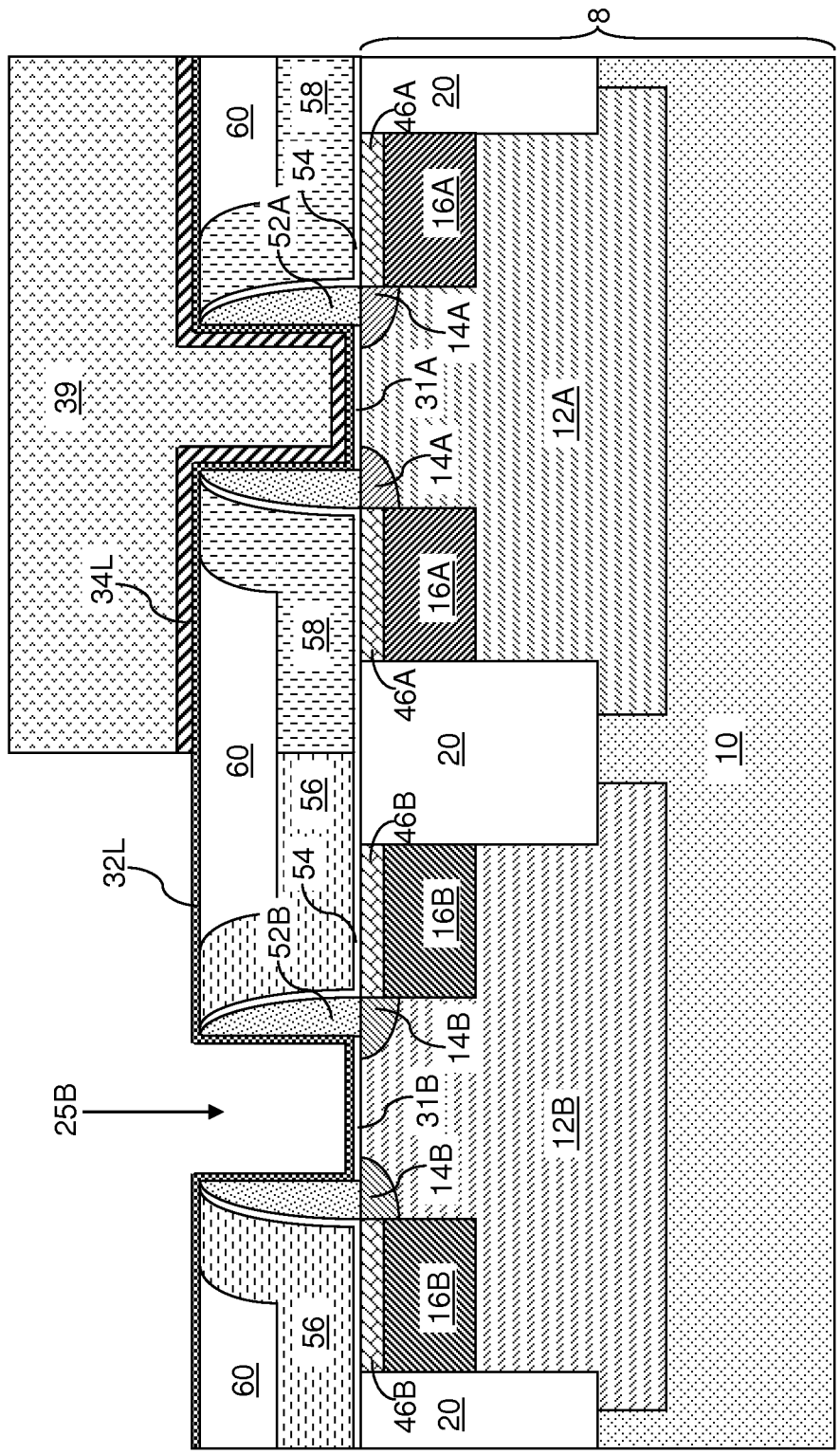
FIG. 5 is a vertical cross-sectional view of the exemplary semiconductor structure of FIG. 4 after application of a photoresist and lithographic patterning of the first-type work function metal layer.

Referring to FIG. 5, a first photoresist 39 is applied and lithographic patterned so that the first photoresist 39 covers the area over the second conductivity type well 12A, while the top surface of the first-type work function metal layer 34L is exposed over the first conductivity type well 12B. The pattern in the first photoresist 39 is transferred into the first-type work function metal layer 34L by an etch. The portion of the first-type work function metal layer 34L within the second gate cavity 25B is removed employing the first photoresist 39 as an etch mask. The first photoresist 39 is removed, for example, by ashing or wet etching. After the patterning of the first-type work function metal layer 34L, the first-type work function metal layer 34L is present in the first gate cavity 25A (See FIG. 4), but is not present in the second gate cavity 25B.

Figure 6:
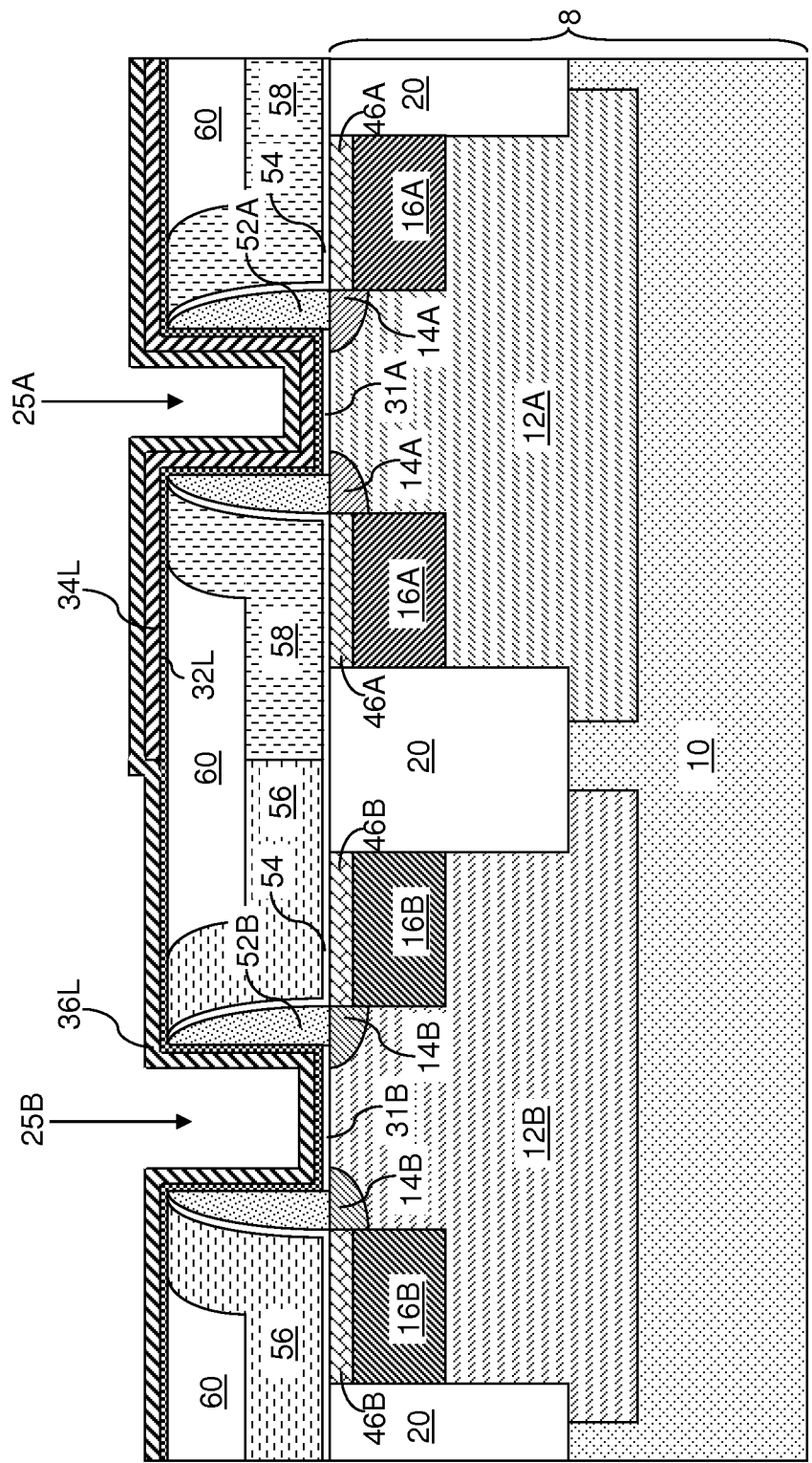
FIG. 6 is a vertical cross-sectional view of the exemplary semiconductor structure of FIG. 5 after removal of the photoresist and formation of a second-type work function metal.

Referring to FIG. 6, a second-type work function metal layer 36L is deposited. The second-type work function metal layer 36L includes a second metal having a second work function, which is different from the first work function. The second metal of the second-type work function metal layer 36L is selected to optimize the performance of a transistor to be subsequently formed employing the second source and drain extension regions 14B, the second source and drain regions 16B, and the first conductivity type well 12B.

In the first embodiment, the second conductivity type is n-type and the semiconductor material of the first conductivity type well 12B includes p-doped silicon, and the second-type work function metal layer 36L includes a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. For example, the second-type work function metal layer 36L can be a layer of TiAl.

In the second embodiment, the second conductivity type is p-type and the semiconductor material of the first conductivity type well 12B includes n-doped silicon, and the second-type work function metal layer 36L includes a silicon valence band edge metals such as Pt, Rh, Ir, Ru, Cu, Os, Be, Co, Pd, Te, Cr, Ni, TiN, and alloys thereof. For example, the second-type work function metal layer 36L can be a layer of TiN.

The second-type work function metal layer 36L can be formed, for example, by physical vapor deposition, chemical vapor deposition, or atomic layer deposition (ALD). The thickness of the second-type work function metal layer 34L is typically set at a value from 2 nm to 100 nm, and more typically, from 3 nm to 10 nm, although lesser and greater thicknesses can also be employed.

In the first and second embodiments, one of the first and second work functions is closer to the conduction band of the semiconductor material of the first conductivity type well 12B and the second conductivity type well 12A than the valence band of that semiconductor material, and the other of the first and second work functions is closer to the valence band than to the conduction band of that material. Typically, the work function that is closer to the conduction band than to the valence band of the semiconductor material is employed to enhance the performance of an n-type field effect transistor, and the work function that is closer to the valence band than to the conduction band of the semiconductor material is employed to enhance the performance of a p-type field effect transistor.

Figure 7:
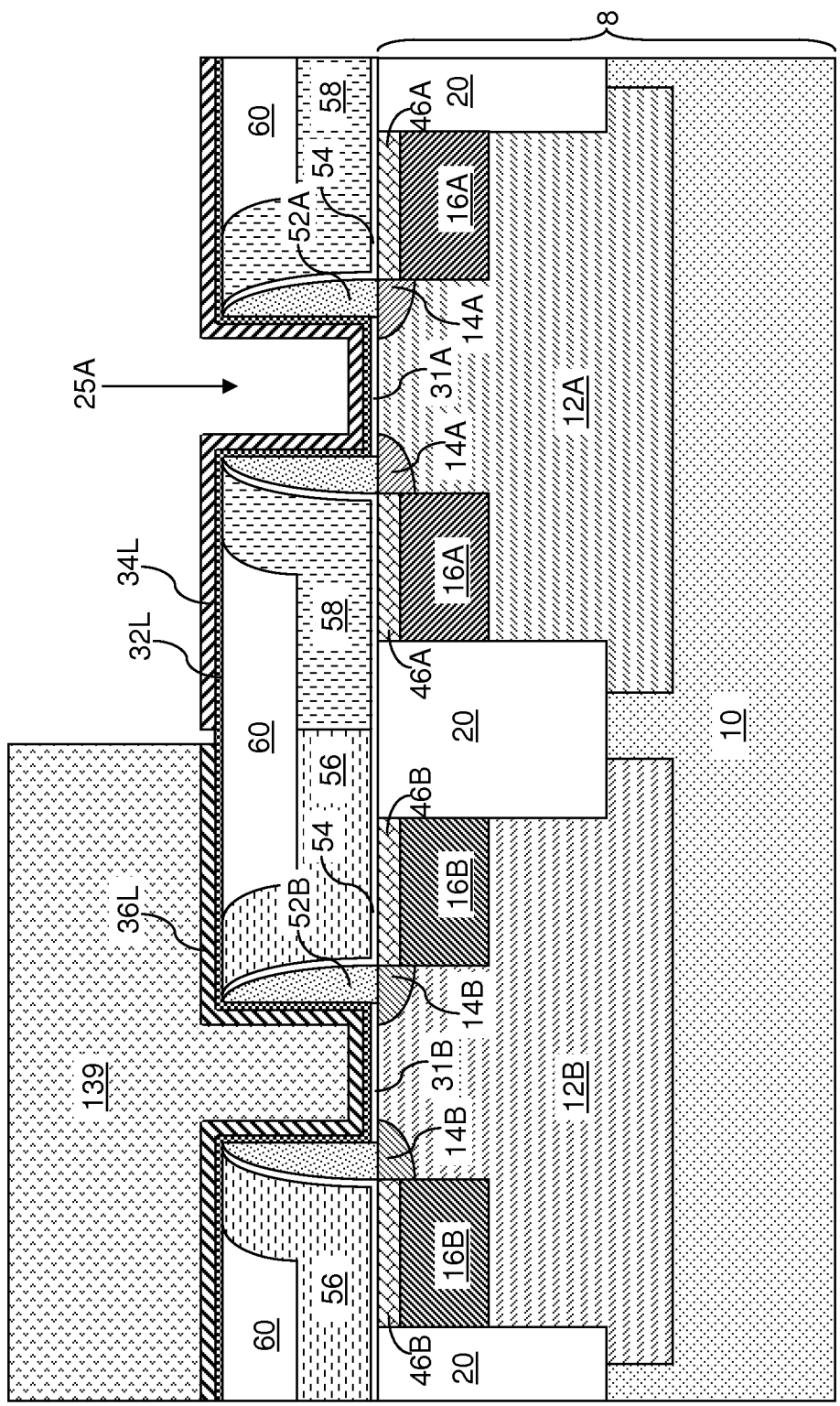
FIG. 7 is a vertical cross-sectional view of the exemplary semiconductor structure of FIG. 6 after patterning the second-type work function.

Referring to FIG. 7, a second photoresist 139 is applied and lithographic patterned so that the second photoresist 139 covers the area over the first conductivity type well 12B, while the top surface of the second-type work function metal layer 36L is exposed over the second conductivity type well 12A. The pattern in the second photoresist 139 is transferred into the second-type work function metal layer 36L by an etch. The portion of the second-type work function metal layer 36L within the first gate cavity 25A is removed employing the second photoresist 37 as an etch mask during the etch. The second photoresist 139 is removed, for example, by ashing or wet etching. After the patterning of the second-type work function metal layer 36L, the second-type work function metal layer 36L is present in the second gate cavity 25B (See FIG. 6), but is not present in the first gate cavity 25A.

Figure 8:
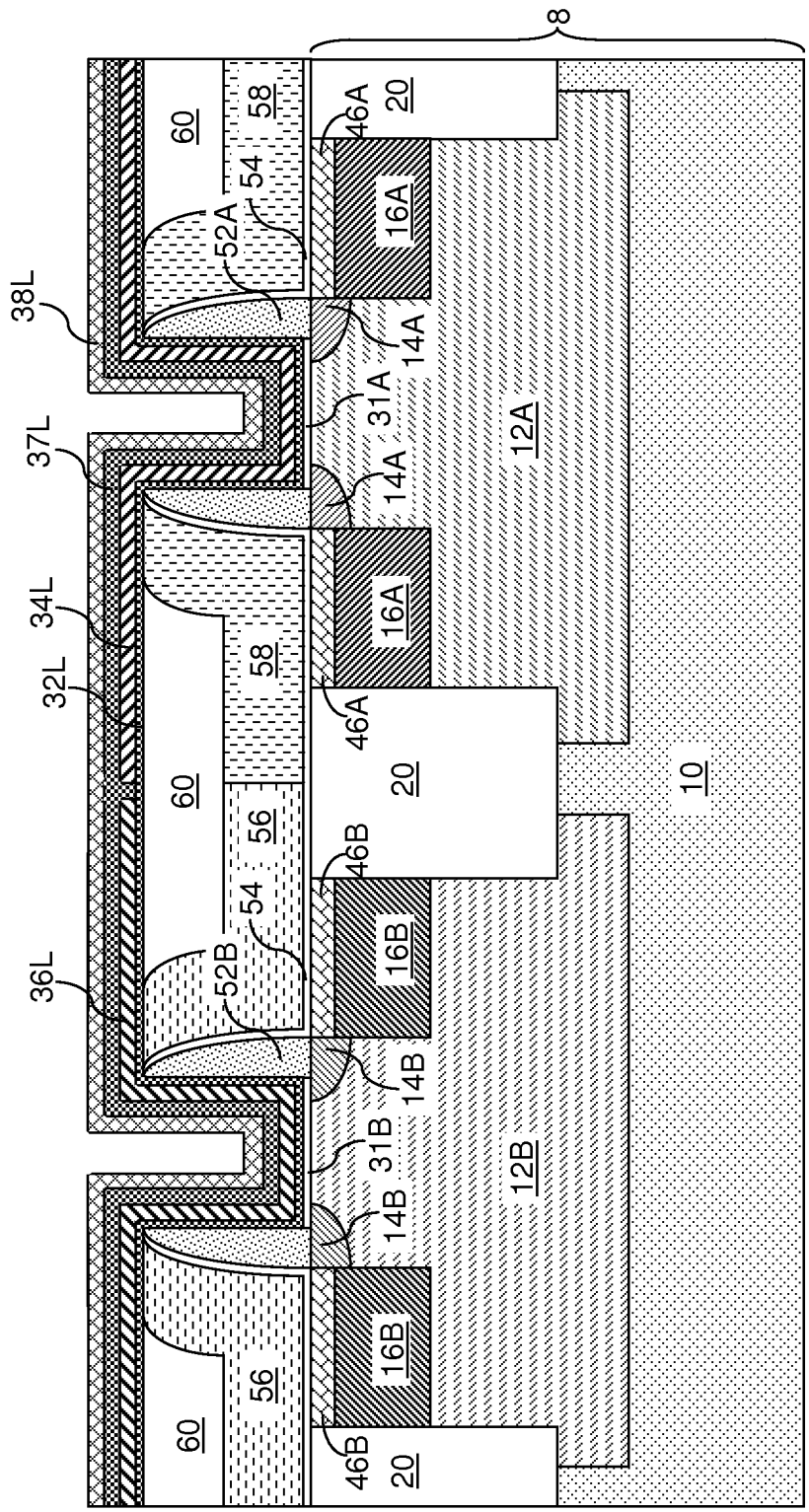
FIG. 8 is a vertical cross-sectional view of the exemplary semiconductor structure of FIG. 7 after deposition of a lower metallic barrier layer and an upper metallic barrier layer.
Figure 9:
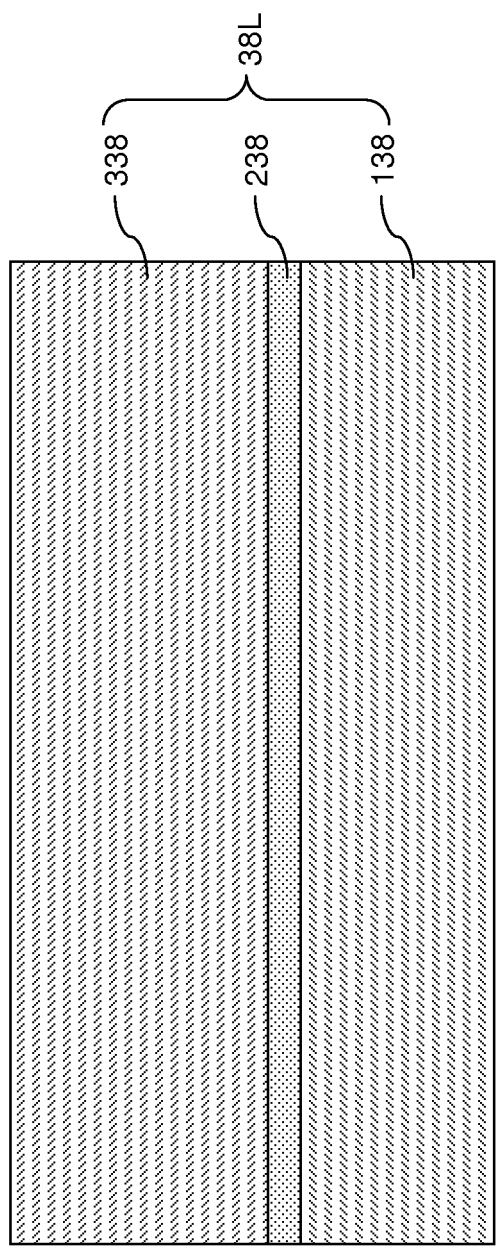
FIG. 9 is a magnified view of a portion of the upper metallic barrier layer of FIG. 8.

Referring to FIGS. 8 and 9, an optional at least one work function adjustment layer 37L can be deposited. Optional at least one work function adjustment layer 37 can include one or more optional metallic layers that can adjust the work functions of the transistors to be subsequently formed on the first conductivity type well 12B and the second conductivity type well 12A. As a non-limiting illustrative example, the optional at least one work function adjustment layer 37L can include a stack, from bottom to top, of a first titanium nitride layer, a tantalum nitride layer, a second titanium nitride layer, and a titanium aluminum alloy layer. Alternately, the optional at least one work function adjustment layer 37L can include only a subset of the stack of the first titanium nitride layer, the tantalum nitride layer, the second titanium nitride layer, and the titanium aluminum alloy layer, or can even be omitted.

At least one barrier metal layer 38L is deposited on the first-type work function metal layer 34L and the second-type work function metal layer 36L. In one embodiment of the present disclosure, the at least one barrier metal layer 38L includes a lower barrier metal layer 138 including a metal, a metal oxide monolayer 238 including an oxide of the metal, and an upper barrier metal layer 228 including the metal. For example, the lower barrier metal layer 138 can be a titanium nitride layer, the metal oxide monolayer 238 can be a monolayer of titanium oxide, and the upper barrier metal layer 338 can be another titanium nitride layer.

In case the at least one barrier metal layer 38L includes a stack, from bottom to top, of a lower barrier metal layer 138 including titanium nitride, a metal oxide monolayer 238 including a monolayer of titanium oxide, and an upper barrier metal layer 338 including titanium nitride, the effect of the presence of the metal oxide monolayer 238 within the stack can have the effect of raising the work function of the at least one barrier metal layer 38L by up to 70 mV relative to a barrier metal layer including only titanium nitride and having a thickness that is equal to the sum of the thicknesses of the lower barrier metal layer 138 including titanium nitride and the upper barrier metal layer 338 including titanium nitride layer.

The stack of the lower barrier metal layer 138 including titanium nitride, the metal oxide monolayer 238 including a monolayer of titanium oxide, and the upper barrier metal layer 338 including titanium nitride can be formed by a two-step deposition process with an oxidation process therebetween. Specifically, a lower titanium nitride layer having a thickness from 0.5 nm to 5 nm can be deposited first, followed by exposure of the upper surface of the lower titanium nitride layer to an oxidizing ambient, and then an upper titanium nitride layer having a thickness from 1 nm to 10 nm can be deposited.

In one embodiment, the lower titanium nitride layer and the upper titanium nitride layer can be deposited by physical vapor deposition, and the monolayer of titanium oxide can be formed by exposing the top surface of the lower titanium nitride layer to an oxidizing ambient. The deposition temperature for the lower and upper titanium nitride layers can be between 20° C. and 450° C., and is typically about 350° C. The oxidizing ambient for forming the monolayer of titanium oxide can have oxygen partial pressure of 100 mTorr to 100 Torr at a temperature from 20° C. to 600° C., and typically from 350° C. to 450° C., although lesser and greater oxygen partial pressures and/ore lesser and greater oxidation temperatures can also be employed. The oxidation time can be adjusted to limit the thickness of the titanium oxide on the surface of the lower titanium nitride layer to a monolayer. The formation of the titanium oxide can be a self-limiting process in which the thickness of the titanium oxide formed on the surface of the lower titanium nitride layer is limited to a single monolayer as long as the predominant mechanism of oxygen incorporation is adsorption to the surface of the lower titanium nitride layer, and a bulk diffusion of oxygen into the lower titanium nitride layer is insignificant.

The effect of the presence of the metal oxide monolayer 238 in the form of the monolayer of titanium oxide in the metal stack is an increase in the work function of the material stack. This increase in the work function can be about 70 mV if the lower titanium nitride layer and the upper titanium nitride layer are deposited by physical vapor deposition. The increase in the work function tends to decrease if the lower titanium nitride layer and the upper titanium nitride layer are deposited by atomic layer deposition. In view of the general result of reduction in the work function due to any oxidation process as illustrated in FIG. 1, this is an unexpected result because the direction of change in the work function, i.e., the increase in the work function, is contrary to the general reduction of work function as a result of any oxidation processing step introduced to a replacement gate electrode. Further, the amount of increase in the work function due to the presence of a monolayer of titanium oxide between two layers of titanium nitride is significant because such an increase, particularly in combination of additional methods that increase the work function even further, can enhance the performance of a p-type field effect transistor.

Figure 10:
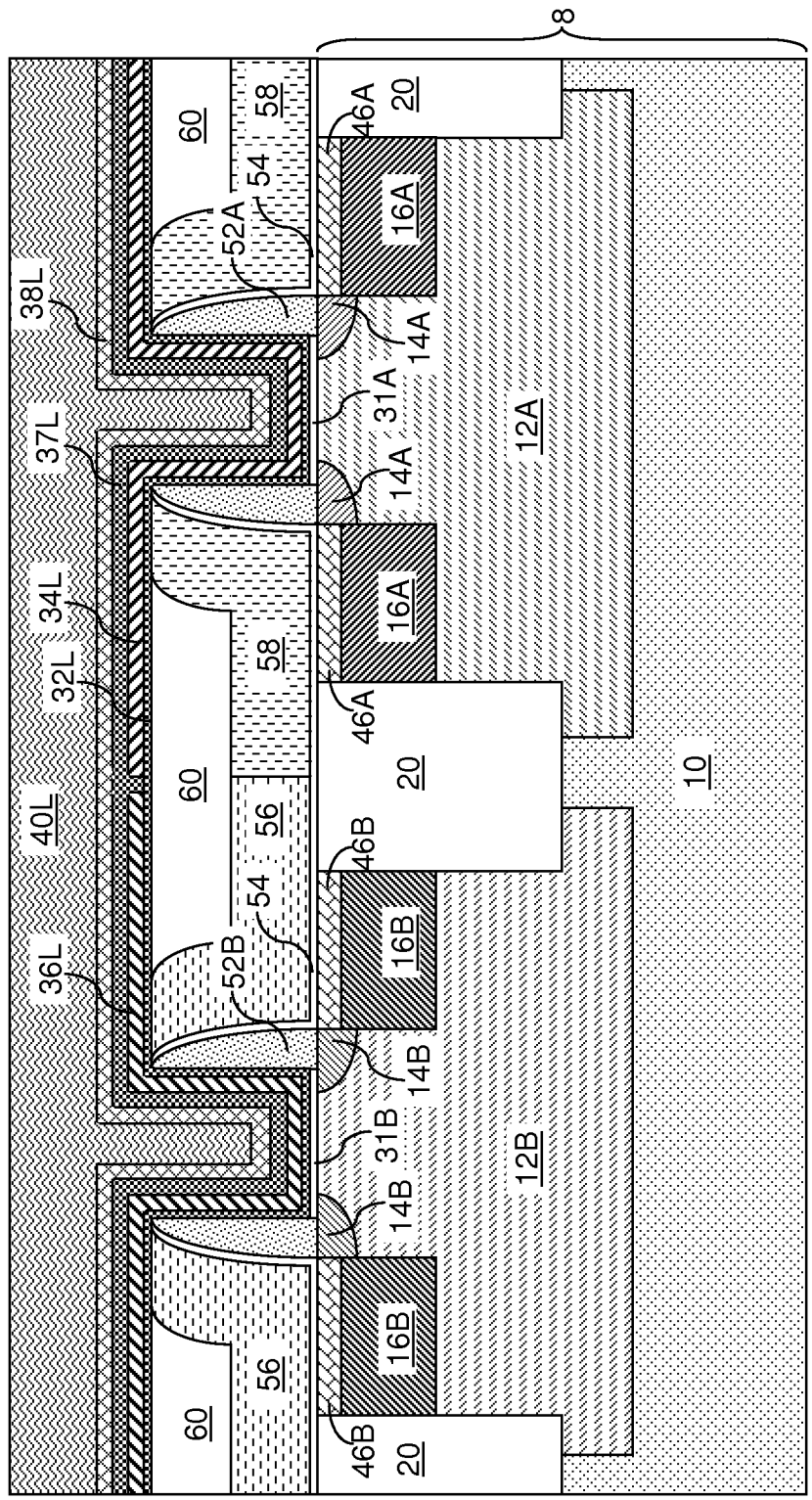
FIG. 10 is a vertical cross-sectional view of the exemplary semiconductor structure of FIG. 8 after deposition of a conductive metal layer.

Referring to FIG. 10, a conductive metal layer 40L is deposited on the at lest one barrier metal layer 38L. The conductive metal layer 40L includes a conductive material such as aluminum deposited by physical vapor deposition. High temperature aluminum deposition process at or about 440° C. is known to provide good reflow characteristics so that gate cavities can be completely filled upon deposition of the conductive metal layer 40L.

The conductive metal layer 40L can an aluminum-including layer that includes aluminum as a predominant component. For example, the aluminum-including layer can include at least 98% of aluminum in atomic concentration. The aluminum-including layer can consist essentially of aluminum so that the electrical conductivity of the conductive metal layer 40L is maximized.

In one embodiment, the aluminum-including layer can be deposited at a temperature that reduces reflow rate of the deposited material. While this method is contrary to the generally known method of enhancing the fill property of the deposited material, the reduction of the deposition temperature of the aluminum-including material has the unexpected effect of raising the work function of the material stack including the aluminum-including layer. Specifically, when the aluminum-including layer including at least 98% of aluminum in atomic concentration is deposited at a temperature not exceeding 420° C., the work function of the material stack including the aluminum-including layer can increase significantly. For example, a tested sample including an aluminum layer deposited at 400° C. by physical vapor deposition in vacuum environment had a work function that was 70 mV greater than a control sample including an aluminum layer deposited at 440° C. by physical vapor deposition in vacuum environment and otherwise subjected to the same processing conditions.

While the cause is unclear as to why the work function increases for a gate electrode employing an aluminum layer deposited at a lower temperature relative to the work function of other gate electrodes employing an aluminum layer deposited at the conventional aluminum deposition temperature of 440° C., one possible speculation is that the lower deposition temperature affects microcrystalline structure and the grain size of the deposited aluminum material. Further, the lack of reflow may have an effect on the increase in the work function of the gate electrode employing the aluminum layer deposited at a lower temperature. Because some reflow is necessary to fill the gate cavities, however, the deposition temperature for the aluminum layer cannot be decreased indefinitely. Selection of a deposition temperature not less than 380° C. and not greater than 440° C. is a good compromise between the requirement that the work function of the gate stack be increased significantly (e.g., on the order of 70 mV), and the requirement that the gate cavities be filled.

Figure 11:
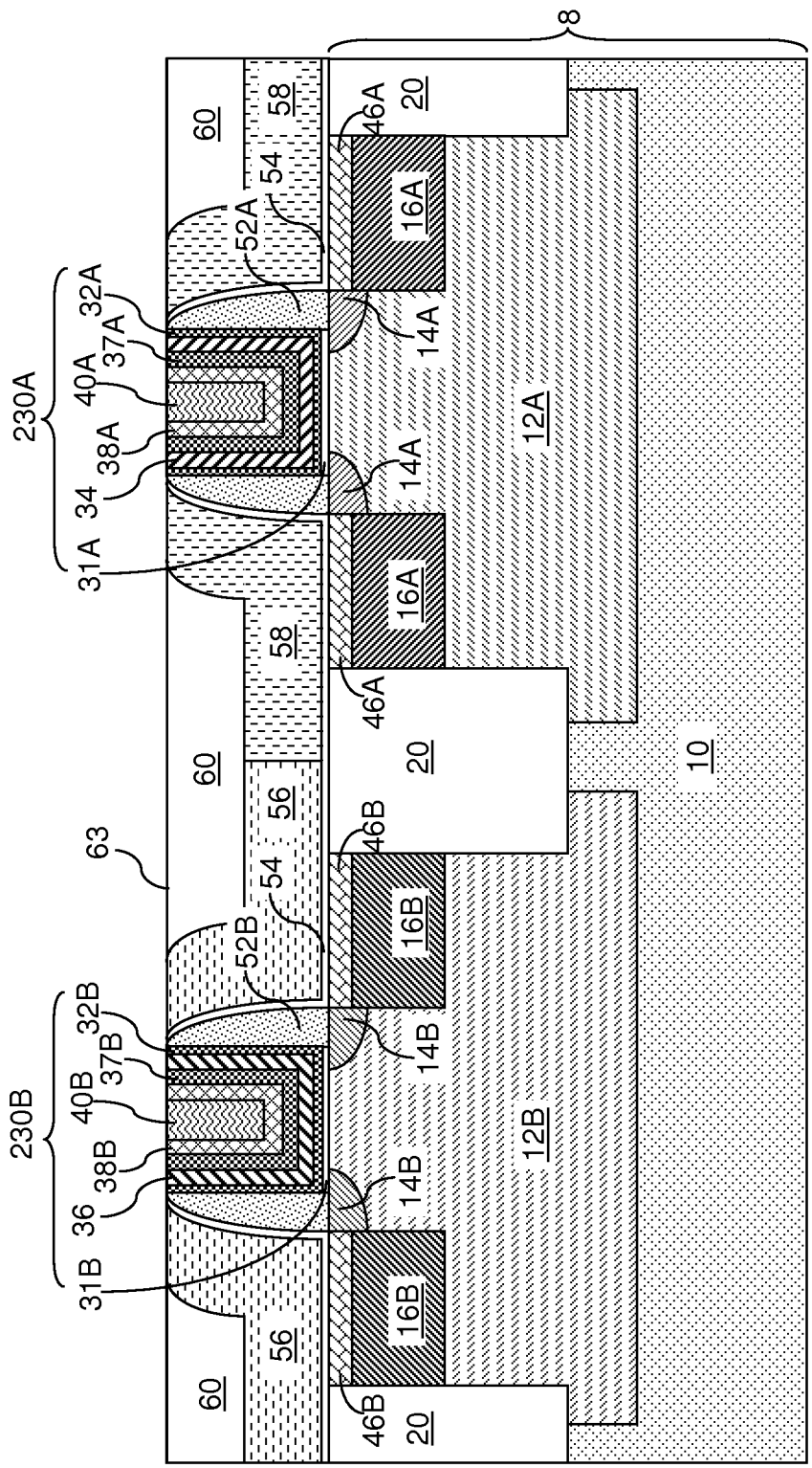
FIG. 11 is a vertical cross-sectional view of the exemplary structure of FIG. 10 after planarization.

Referring to FIG. 11, portions of the conductive material layer 40L, the second-type work function metal layer 36L, the first-type work function metal layer 34L, and the portion of the contiguous gate dielectric layer 32L are removed from above the planar dielectric surface 63 of the planarization dielectric layer 63 by employing a planarization process.

A first field effect transistor is formed in the region of the second conductivity type well 12A. The first field effect transistor includes the second conductivity type well 12A, the first source and drain extension regions 14A, the first source and drain regions 16A, a first metal semiconductor alloy portions 64A, the optional first semiconductor-element-containing dielectric layer 31A, and a first replacement gate stack 230A. The first replacement gate stack 230A includes a stack, from bottom to top, of a first gate dielectric 32A which is a remaining portion of the contiguous gate dielectric layer 32L, a first-type work function metal portion 34 which is a remaining portion of the first-type work function metal layer 34L, a first optional work function adjustment portion 37A that is a portion of the optional at least one work function adjustment layer 37L, a first barrier metal portion 38A which is a remaining portion of the at least one barrier metal layer 38L, and a first conductive material portion 40A which is a remaining portion of the conductive material layer 40L. The first second-type work function metal portion 38A includes the second metal and contacts the first-type work function metal portion 34 that includes the first metal.

A second field effect transistor is formed in the region of the first conductivity type well 12B. The second field effect transistor includes the first conductivity type well 12B, the second source and drain extension regions 14B, the second source and drain regions 16B, a second metal semiconductor alloy portions 64B, the optional second semiconductor-element-containing dielectric layer 31B, and a second replacement gate stack 230B. The second replacement gate stack 230B includes a stack, from bottom to top, of a second gate dielectric 32B which is a remaining portion of the contiguous gate dielectric layer 32L, a second-type work function metal portion 36 which is a remaining portion of the second-type work function metal layer 36L, a second optional work function adjustment portion 37B that is a portion of the optional at least one work function adjustment layer 37L, a second barrier metal portion 38B which is a remaining portion of the at least one barrier metal layer 38L, and a second conductive material portion 40B which is a remaining portion of the conductive material layer 40L.

In the first embodiment, the first conductivity type is p-type, the second conductivity type is n-type, and the first field effect transistor is a p-type transistor, and the second field effect transistor is an n-type field effect transistor. In the second embodiment, the first conductivity type is n-type, the second conductivity type is p-type, and the first field effect transistor is an n-type transistor, and the second field effect transistor is a p-type field effect transistor.

Each of the first and second gate dielectrics (32A, 32B) includes a horizontal gate dielectric portion and a vertical gate dielectric portion extending upward from peripheral regions of the horizontal gate dielectric portion. The first conductive material portion 40A contacts an upper surface and inner sidewalls of the first second-type work function metal portion 38A. The second conductive material portion 40B contacts an upper surface and inner sidewalls of the second second-type work function metal portion 36.

Figure 12:
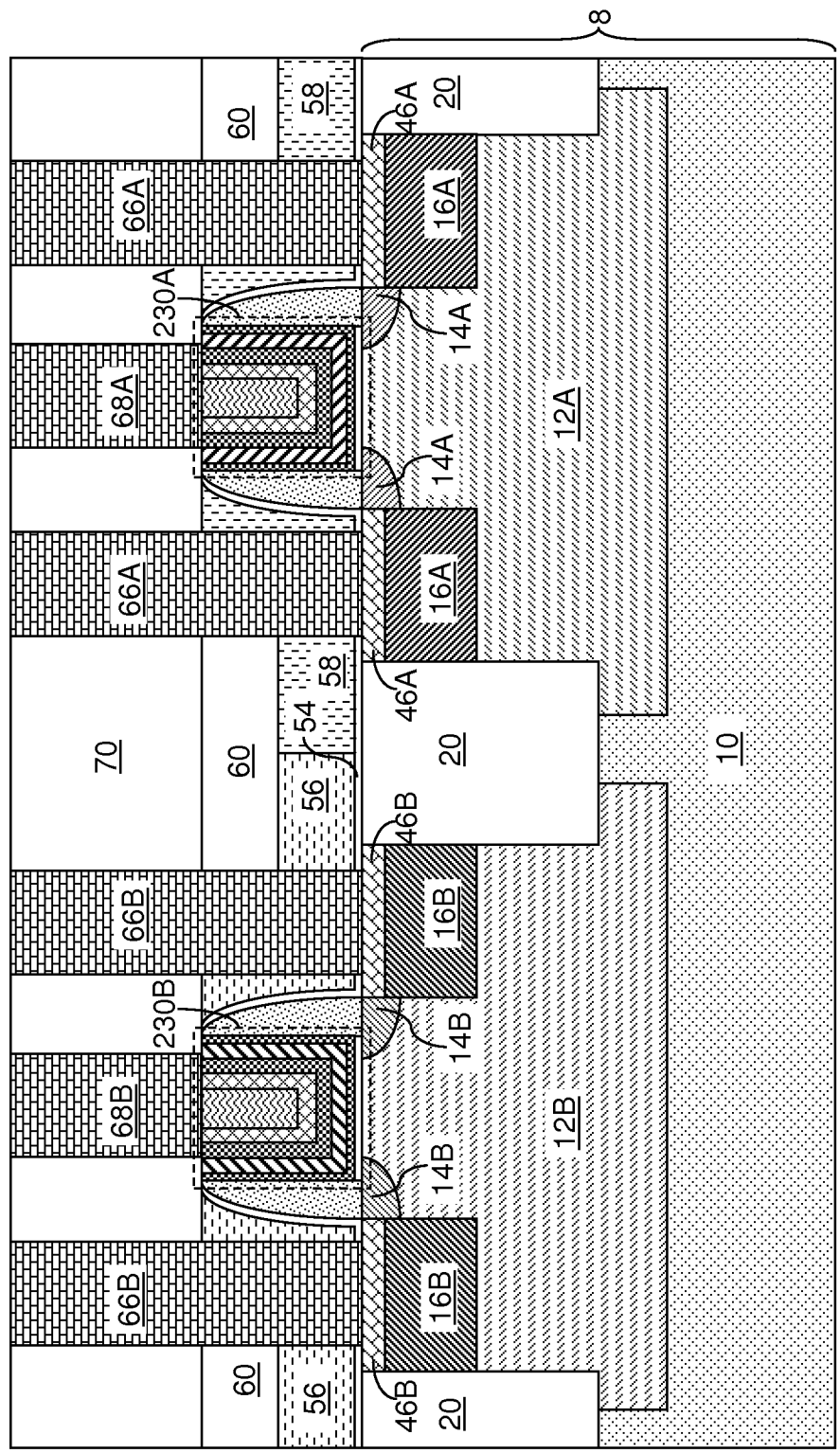
FIG. 12 is a vertical cross-sectional view of the exemplary structure of FIG. 11 after formation of a via-level dielectric layer and contact via structures.

Referring to FIG. 12, a contact-level dielectric layer 70 is deposited over the planarization dielectric layer 60. Various contact via structures can be formed, for example, by formation of contact via cavities by a combination of lithographic patterning and an anisotropic etch followed by deposition of a conductive material and planarization that removes an excess portion of the conductive material from above the contact-level dielectric layer 70. The various contact via structures can include, for example, first source/drain contact via structures 66A, second source/drain contact via structures 66B, a first gate contact via structure 68A, and a second gate contact via structure 68B.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a semiconductor structure comprising a field effect transistor, said method comprising:
    forming a disposable gate structure on a semiconductor substrate;
    forming and planarizing a planarization dielectric layer, wherein a top surface of said planarization dielectric layer is coplanar with a top surface of said disposable gate structure;
    recessing said disposable gate structure to form a gate cavity; and
    forming a replacement gate stack in said cavity, wherein said replacement gate stack is formed by depositing and patterning a stack including at least a gate dielectric layer, a work function metal layer deposited on said gate dielectric layer, a lower barrier metal layer comprising a metal deposited on said work function metal layer, a metal oxide monolayer comprising an oxide of said metal and contacting said lower barrier metal layer, an upper barrier metal layer contacting said metal oxide monolayer.

2. The method of claim 1, wherein said lower barrier metal layer is a titanium nitride layer, said metal oxide monolayer is a monolayer of titanium oxide, and said upper barrier metal layer is another titanium nitride layer.

3. The method of claim 2, wherein said lower barrier metal layer and said upper barrier metal layer are deposited by physical vapor deposition, and said monolayer of titanium oxide is formed by exposing a top surface of said titanium nitride layer to an oxidizing ambient.

4. The method of claim 2, wherein said lower barrier metal layer has a thickness from 0.5 nm to 5 nm, and said upper barrier metal layer has a thickness from 1 nm to 10 nm.

5. The method of claim 1, wherein said gate dielectric layer includes a dielectric material having a dielectric constant greater than 8.0, and said work function metal layer includes a metal having a work function that is greater than 4.55 eV.

6. The method of claim 1, wherein stack further comprises an aluminum-including layer deposited on said upper barrier metal layer at a temperature not greater than 420 degrees Celsius.

7. The method of claim 6, wherein said aluminum-including layer is deposited at a temperature greater than 380 degrees Celsius.

8. A method of forming a semiconductor structure comprising a field effect transistor, said method comprising:
    forming a disposable gate structure on a semiconductor substrate;
    forming and planarizing a planarization dielectric layer, wherein a top surface of said planarization dielectric layer is coplanar with a top surface of said disposable gate structure;
    recessing said disposable gate structure to form a gate cavity; and
    forming a replacement gate stack in said cavity, wherein said replacement gate stack is formed by depositing and patterning a stack including, from bottom to top, a gate dielectric layer, a work function metal layer, at least one barrier metal layer, and an aluminum-including layer, wherein said aluminum layer is deposited at a temperature not greater than 420 degrees Celsius, wherein said at least one barrier metal layer includes a lower barrier metal layer comprising a metal, a metal oxide monolayer comprising an oxide of said metal, and an upper barrier metal layer.

9. The method of claim 8, wherein said aluminum-including layer is deposited at a temperature greater than 380 degrees Celsius.

10. The method of claim 8, wherein said aluminum-containing layer includes at least 98% of aluminum in atomic concentration.

11. The method of claim 8, wherein said aluminum-containing layer is deposited by physical vapor deposition in vacuum environment.

12. The method of claim 8, wherein said gate dielectric layer includes a dielectric material having a dielectric constant greater than 8.0, and said work function metal layer includes a metal having a work function that is greater than 4.55 eV.

13. The method of claim 8, wherein said lower barrier metal layer is a titanium nitride layer, said metal oxide monolayer is a monolayer of titanium oxide, and said upper barrier metal layer is another titanium nitride layer.

14. The method of claim 13, wherein said lower barrier metal layer and said upper barrier metal layer are deposited by physical vapor deposition, and said monolayer of titanium oxide is formed by exposing a top surface of said titanium nitride layer to an oxidizing ambient.

15. A method of forming a semiconductor structure comprising a field effect transistor, said method comprising:
    forming a disposable gate structure on a semiconductor substrate;
    forming and planarizing a planarization dielectric layer, wherein a top surface of said planarization dielectric layer is coplanar with a top surface of said disposable gate structure;
    recessing said disposable gate structure to form a gate cavity; and
    forming a replacement gate stack in said cavity, wherein said replacement gate stack is formed by depositing and patterning a stack including at least a gate dielectric layer, a lower barrier metal layer comprising a metal, a metal oxide monolayer comprising an oxide of said metal and contacting said lower barrier metal layer, an upper barrier metal layer contacting said metal oxide monolayer, wherein said lower barrier metal layer is a titanium nitride layer, said metal oxide monolayer is a monolayer of titanium oxide, and said upper barrier metal layer is another titanium nitride layer.

16. The method of claim 15, wherein said lower barrier metal layer and said upper barrier metal layer are deposited by physical vapor deposition, and said monolayer of titanium oxide is formed by exposing a top surface of said titanium nitride layer to an oxidizing ambient.

* * * * *